(12) United States Patent
Yin et al.

(10) Patent No.: US 11,906,381 B2
(45) Date of Patent: Feb. 20, 2024

(54) MAGNETICALLY INDUCED TORQUE MEASUREMENT DEVICE AND METHOD BASED ON TORSIONAL SPRING METHOD

(71) Applicants: Fudan University, Shanghai (CN); SGS-CSTC Standards Technical Services (Shanghai) Co., Ltd., Shanghai (CN)

(72) Inventors: Yong Yin, Shanghai (CN); Xiaomei Wu, Shanghai (CN); Dirong Ma, Shanghai (CN)

(73) Assignees: Fudan University, Shanghai (CN); SGS-CSTC Standards Technical Services (Shanghai) Co., Ltd., Shanghai (CN)

(*) Notice: Subject to any disclaimer, the term of this patent is extended or adjusted under 35 U.S.C. 154(b) by 0 days.

(21) Appl. No.: 18/109,540

(22) Filed: Feb. 14, 2023

(65) Prior Publication Data
US 2023/0258516 A1  Aug. 17, 2023

(30) Foreign Application Priority Data

Feb. 15, 2022 (CN) .......................... 202210135666.2

(51) Int. Cl.
*G01L 3/10* (2006.01)
*G01R 33/30* (2006.01)

(52) U.S. Cl.
CPC ............ *G01L 3/101* (2013.01); *G01R 33/307* (2013.01)

(58) Field of Classification Search
CPC .............................. G01L 3/101; G01R 33/307
See application file for complete search history.

(56) References Cited

FOREIGN PATENT DOCUMENTS

| CN | 203837847 U | * | 9/2014 | |
|---|---|---|---|---|
| CN | 112526422 A | | 3/2021 | |
| CN | 113310612 A | * | 8/2021 | ............... G01L 3/00 |

(Continued)

OTHER PUBLICATIONS

Lu Liyuan et al., Safety Evaluation Methods for Compatibility of Surgical Implants in the Magnetic Resonance Environment and the Testing Platform Building, Chinese Medical Device Information, 2020, pp. 18-22.

(Continued)

*Primary Examiner* — Octavia Davis Hollington
(74) *Attorney, Agent, or Firm* — Zhigang Ma

(57) ABSTRACT

The invention relates to the field of detection of implantable medical devices, particularly to magnetically induced torque measurement devices and method of implants in magnetic resonance imaging systems. The measurement device includes transmission shafts, gear sets, a knob, an indicator, a detachable torsion spring set, a loading tray, a protractor, and an MRI-compatible camera. The measurement device changes its measurement range by replacing the detachable torsion spring set, adjusts a height of the loading tray by a lifting platform, amplifies a rotation angle of the knob by the gear sets, and records deflection angles of the loading tray by the MRI-compatible camera. The measurement device provides the detachable torsion spring set, which is suitable for measuring most samples; and provides a height-adjustable loading tray, which can be applied to MR systems with different center heights.

7 Claims, 5 Drawing Sheets

(56) References Cited

FOREIGN PATENT DOCUMENTS

KR        102472764 B1 * 11/2022

OTHER PUBLICATIONS

CNIPA, Notification of a Second Office Action for CN202210135666.2, dated Apr. 11, 2023.
Fudan University, Tongbiao Standard Technical Services (Shanghai) Co.,Ltd (Applicants), Reply to Notification of a Second Office Action for CN202210135666.2, dated Jun. 14, 2023.
CNIPA, Notification to grant patent right for invention in CN202210135666.2, dated Jul. 19, 2023.
Fudan University, Tongbiao Standard Technical Services (Shanghai) Co.,Ltd (Applicants), allowed claims for CN202210135666.2, dated Jul. 19, 2023.

* cited by examiner

MAGNETICALLY INDUCED TORQUE MEASUREMENT DEVICE AND METHOD BASED ON TORSIONAL SPRING METHOD

TECHNICAL FIELD

The disclosure relates to the field of detection technologies of implantable medical devices, particularly to magnetically induced torque measurement devices and the test method of magnetically induced torque in magnetic resonance (MR) systems.

BACKGROUND

Since the 1980s, magnetic resonance imaging (MRI) has been widely used as a means of medical imaging examination and gradually popularized. Meanwhile, clinical applications of implantable medical devices/instruments are also increasing. However, due to the addition of ferromagnetic materials in the manufacturing processes of some implants, there is a possibility of heat generation and displacement in applications of MRI, which has a potential risk in the MRI examination of implant carriers. The standard ASTM F2213-06 issued by the American Society for Testing and Materials specifies a measurement method of magnetically induced torque of implants, in which a magnetically induced torque measurement device based on a torsional spring method for quantitative measurement of magnetically induced torque is introduced.

However, the description of the measurement device of magnetically induced torque by the torsional spring method in the standard is relatively brief. Specifically, no detailed description of the device materials is given, and no method is described for improvement of measurement accuracy and accuracy verification of calculation results. Moreover, the maximum deflection angle specified in the standard limits the measurable torque range of a single measurement device, resulting in a limited number of implant types measured by a single measurement device.

SUMMARY

In order to solve shortages of the existing measurement device, the purpose of the disclosure is to provide a magnetically induced torque measurement device and a torque measurement method, so as to meet measurement requirements of magnetically induced torques of most implants with different volumes and masses, reduce accuracy requirements during manual angle adjustment, improve the accuracy of angle reading by using an MRI-compatible camera, and provide a method mode for verifying the accuracy of calculation values of torque.

Specifically, a magnetically induced torque measurement device according to the disclosure includes:
- a rectangular outer frame 11 and five transmission shafts A, B, C, A', B' secured on the rectangular outer frame, wherein transmission shafts A, B, and transmission shafts A', B' are short shafts, upper ends of transmission shafts A, B are secured on the upper frame of the rectangular outer frame, lower ends of transmission shafts A', B' are secured on the lower frame of the rectangular outer frame; transmission shafts A, B, A', B' are pairwise symmetrical up and down; transmission shaft A and transmission shaft A' are coaxial, transmission shaft B and transmission shaft B' are coaxial, transmission shaft C is a long shaft, and both ends of transmission shaft C are respectively secured on the upper frame and the lower frame of the rectangular outer frame;
- two gear sets, wherein a first gear set of the two gear sets includes four gears 1, 2, 3, 4, and a second gear set of the two gear sets includes four gears 1', 2', 3', 4'; in the first gear set, gear 1 is secured on transmission shaft A, gear 2 and gear 3 are secured on transmission shaft B and rotatable synchronously, gear 4 is secured on transmission shaft C, gear 1 meshes with gear 2, and gear 3 meshes with gear 4; in the second gear set, gears 1', 2', 3', 4' are symmetrically arranged with respect to gears 1, 2, 3, 4 in the first gear set respectively and secured on transmission shafts A', B', C, that is, gear 1' is secured on transmission shaft A', gear 2' and gear 3' are secured on transmission shaft B' and rotatable synchronously, and gear 4' is secured on transmission shaft C;
- a lifting platform 12, arranged on the upper end of transmission shaft A' and coaxial with transmission shaft A', wherein the lifting platform is equipped with an adjustment knob 13 configured (i.e., structured and arranged) to adjust the height of a lower detachable torsion spring and thereby change the height of a loading tray and make the loading tray suitable for MR system with different magnet center heights;
- a protractor 14, attached on the lifting platform and coaxial with transmission shaft A', wherein the protractor is configured to measure the deflection angle of the loading tray;
- four adjustment belts 15, wherein the upper ends of the four adjustment belts are connected to an upper detachable torsion spring by a connecting sheet, the lower ends of the four adjustment belts are fixedly connected to an edge of the loading tray, each of the four adjustment belts is provided with a scale, and the lower end of each of the fourth adjustment belts is equipped of an adjustment buckle configured to change a length of the adjustment belt according to the height of the lifting platform;
- the loading tray 16, secured above the lower detachable torsion spring, wherein the loading tray is configured to fix a to-be-measured sample, and the loading tray is equipped with two indication marks configured to assist reading of the deflection angle of the loading tray;
- an MRI-compatible camera 17, secured on the middle of the rectangular outer frame by MRI-compatible camera support 18 and configured to photograph the deflection angle of the loading tray;
- a detachable torsion spring set, including upper detachable torsion spring 19 and lower detachable torsion spring 20, wherein the upper detachable torsion spring 19 is secured on a lower end of transmission shaft A and rotatable along with the rotation of the gear 1, lower detachable torsion spring 20 is secured on the lifting platform and rotatable along with the rotation of the lifting platform;
- a knob 21, coaxially secured on the middle of transmission shaft C, wherein the knob is provided with angle marking lines configured to display the rotation angle of the loading tray controlled by the knob, and the knob is configured to be rotated to drive the gear sets to rotate through transmission shaft C; and
- an indicator 22, wherein the upper end of the indicator is secured on the upper frame of the rectangular outer frame, the indicator is vertically downward, the lower end of the indicator is aligned with the edge of the knob, and the indicator is configured to obtain an angle change of the loading tray according to a scale when the knob is rotated.

In an embodiment of the disclosure, the rectangular outer frame includes two plates and four supports; the indicator, the MRI-compatible camera support, and transmission shafts A, A', B, B', C are all secured on the rectangular outer frame.

In an embodiment of the disclosure, the detachable torsion spring set is multiple (i.e., more than one) sets, e.g., 2-5 sets, each of the multiple sets comprises two identical torsion springs, so as to make a measurement range of the detachable torsion spring set meets measurement requirements of implanted medical devices.

In an embodiment of the disclosure, the MRI-compatible camera support is detachable and adjustable in height to make the lens of the MRI-compatible camera focus on the protractor.

In an embodiment of the disclosure, the loading tray is provided with evenly distributed perforations, and the perforations are configured to allow a thread to pass through and thereby fix the sample when using the thread to fix the sample.

The magnetically induced torque measure device according to the disclosure can be applied to measure the magnetically induced torque of a sample in MR systems and the method includes:

step 1: calculate the worst gravity moment ($\tau_{worst}=m \cdot L_{maximum} \cdot g$) of a sample according to a mass (m) and a maximum linear dimension ($L_{maximum}$) of the sample, selecting a target detachable torsion spring set according to the worst gravity moment, and securing the target detachable torsion spring set on the measurement device (as illustrated in FIG. 3), where g represents the gravitational acceleration;

step 2: rotate the adjustment knob of the lifting platform to adjust the height of the loading tray to be consistent with a known magnet center height, and simultaneously adjust the lengths of the four adjustment belts to make the four adjustment belts tight;

step 3: fix the sample on the loading tray by a thread, then place the measurement device on the bed of the MR system, and based on a built-in cross-positioning of the MR system, move the bed to position the center of the sample to the magnet center;

step 4: as illustrated in FIG. 4, a tester enters a testing chamber, and turns the knob to adjust the angle of the loading tray and thereby making an axis (c) of the sample coincide with a Z-axis of a magnet coil (as illustrated in FIG. 4 and FIG. 10);

step 5: rotate the knob with 90° to make the loading tray be rotated with 10° (the principle of angle amplification is shown in the following specific embodiments) and continue rotate until the loading tray is rotated with 360°, and record the change of the angle of the loading tray before and after each time of the loading tray being rotated through the MRI-compatible camera;

step 6: calculate the deflection angle of the sample as $\Delta\theta=\theta_{after}-\theta_{before}$ according to recorded angles $\theta_{before}$, $\theta_{after}$ of the loading tray before and after each time of the loading tray being rotated, and calculate the magnetically induced torque (with 36 calculated values in total) of the sample according to formula $\tau=k \cdot \Delta\theta$, where $\tau$ represents the magnetically induced torque, and k represents the elastic coefficient of torsion spring; and step 7: recheck the magnetically induced torque calculated in step 6; when relative errors of all calculated values (e.g., the 36 calculated values in total) are within a specified range, continue using the selected target detachable torsion spring set, change the fixed direction of the to make another axis (a or b) of the sample coincide with the Z axis at an initial measurement position, and repeat steps 4-6; when the relative error of any one of the all calculated values is not within the specified range, replace with a larger or a smaller detachable torsion spring, do not change the fixed direction of the sample, and repeat steps 4-6 until relative errors of all calculated values meet a relative error requirement.

In an embodiment of the disclosure, the rechecking of the magnetically induced torque calculated in step 6, specifically includes:

build a physical interface (as illustrated in FIG. 6) on the center of the upper end of the loading tray, wherein the physical interface is configured to connect a torque screwdriver (as illustrated in FIG. 7, notes: the torque screwdriver is a torque measuring device that is connected to the physical interface and rotated for measurement) in a non-MRI environment;

connect the torque screwdriver to the physical interface, rotate the torque screwdriver to reproduce the deflection angles of the loading tray of the measurement device arranged at the magnet center and loaded with the sample;

record torque readings of the torque screwdriver at the respective deflection angles; and compare recorded torque readings of the torque screwdriver with all calculated values (e.g., 36 calculated values in total) of the magnetically induced torque to obtain the relative errors.

The measurement device according to the disclosure is different from the existing measurement device based on the torsional spring method in which torsion springs cannot be replaced, a measurement range is limited, and the height of the loading tray cannot be adjusted, therefore multiple devices with different specifications are needed to be manufactured so as to be suitable for various samples. The magnetically induced torque measurement device based on the torsional spring method proposed by the disclosure provides a detachable torsional spring set to expand an elastic coefficient range, thereby being suitable for measuring most of the samples, especially implantable instruments/devices. The lifting platform provided by the disclosure enables the height of the loading tray to be adjustable so that the lifting platform is suitable for different MR systems with different magnet center heights. The deflection angle measurement results rechecking method provided by the disclosure can help a tester to confirm the accuracy of the measurement results and replace the detachable torsion spring set according to actual needs. The MRI-compatible camera employed by the measurement device can clearly and accurately record actual deflection angles in the testing chamber with dark light, thereby reducing the reading error caused by the visual angle problem of reading when a tester enters the magnet chamber. The measurement device may have good operability, be easy to carry and have low design and manufacturing costs. The magnetically induced torque measurement device based on the torsional spring method provides convenience for magnetic resonance compatibility verification of implanted medical devices.

Figure 1:
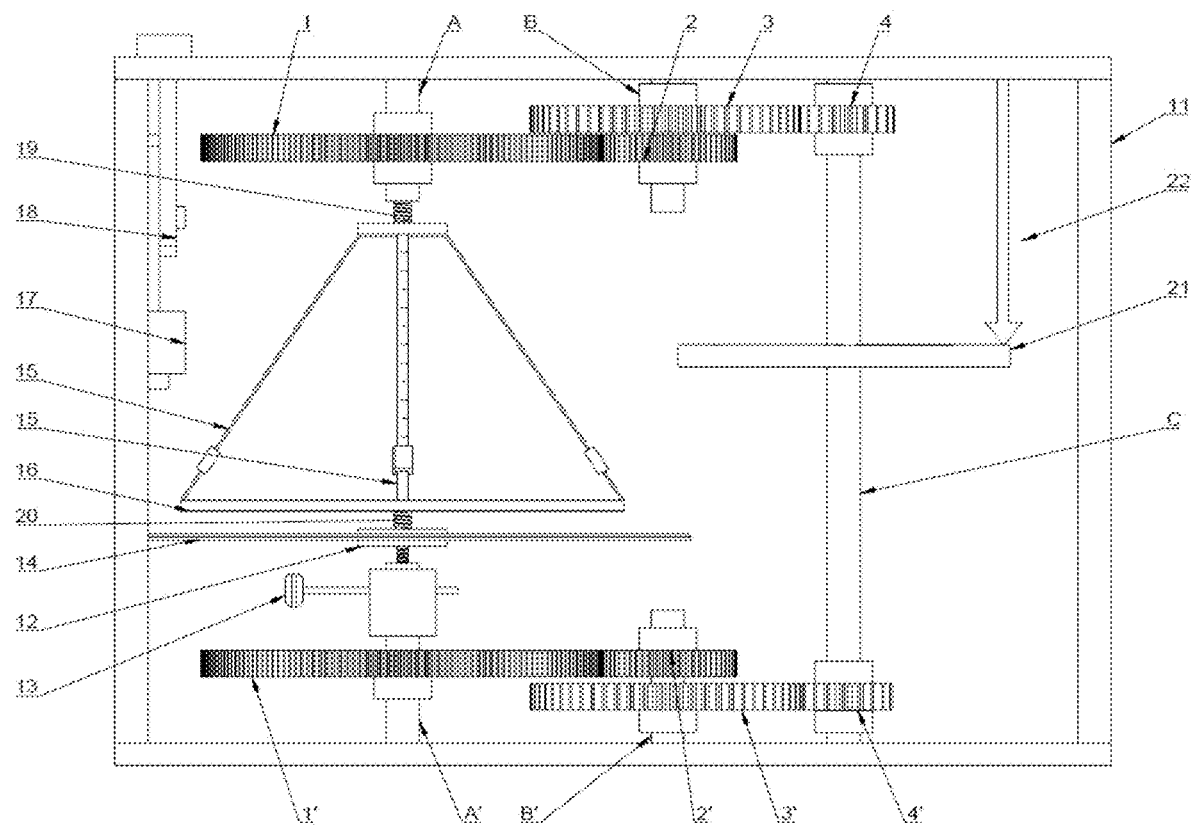
FIG. 1 illustrates a schematic view of a magnetically induced torque measurement device based on a torsional spring method according to the disclosure.
Figure 2:
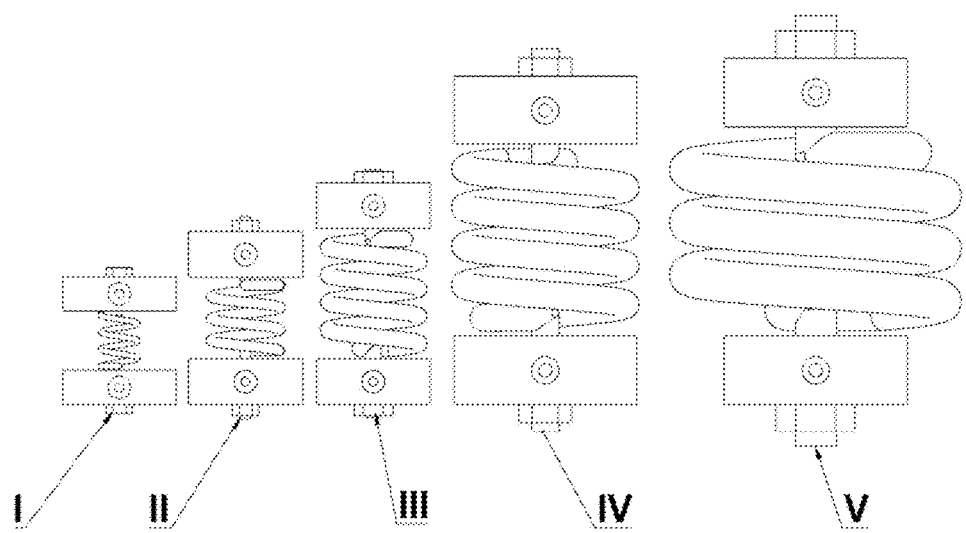
FIG. 2 illustrates a schematic view of a detachable torsion spring set including sets I-V according to the disclosure.

Description of reference symbols in the drawings: 1, 2, 3, 4, 1', 2', 3', 4' represent gears; A, B, C, A', B' represent transmission shafts; 11 represents a rectangular outer frame; 12 represents a lifting platform; 13 represents an adjustment knob of the lifting platform; 14 represents a protractor; 15 represents an adjustment belt; 16 represents a loading tray; 17 represents a nuclear magnetic resonance compatible camera; 18 represents a nuclear magnetic resonance compatible camera support; 19 represents an upper detachable torsion spring; 20 represents a lower detachable torsion spring; 21 represents a knob; and 22 represents an indicator.

DETAILED DESCRIPTION OF EMBODIMENTS

The disclosure will be further described in combination with the accompanying drawings and embodiments.

In order to make the drawing concise, only parts related to the disclosure are labeled in the drawings, and the parts are not all actual structures of the device as a product.

Figure 3:
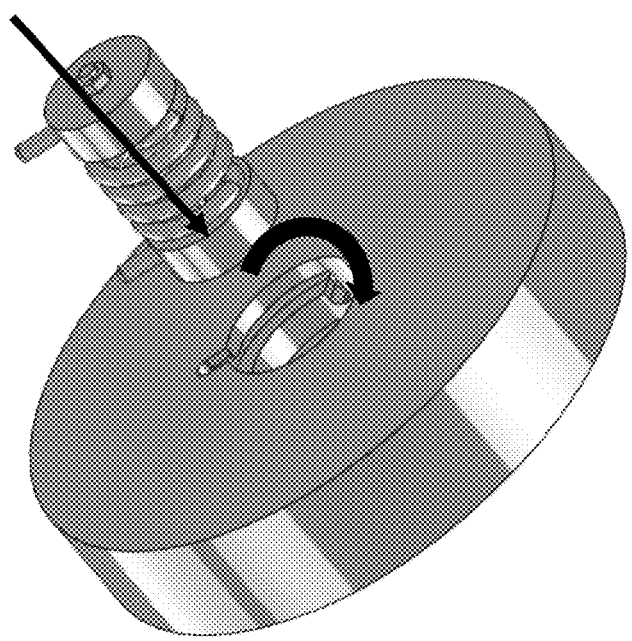
FIG. 3 illustrates a schematic view of the connection of a detachable torsion spring according to the disclosure, two ends of the torsion spring are connected to a transmission shaft, a lifting platform and a loading tray by the illustrated manner.
Figure 4:
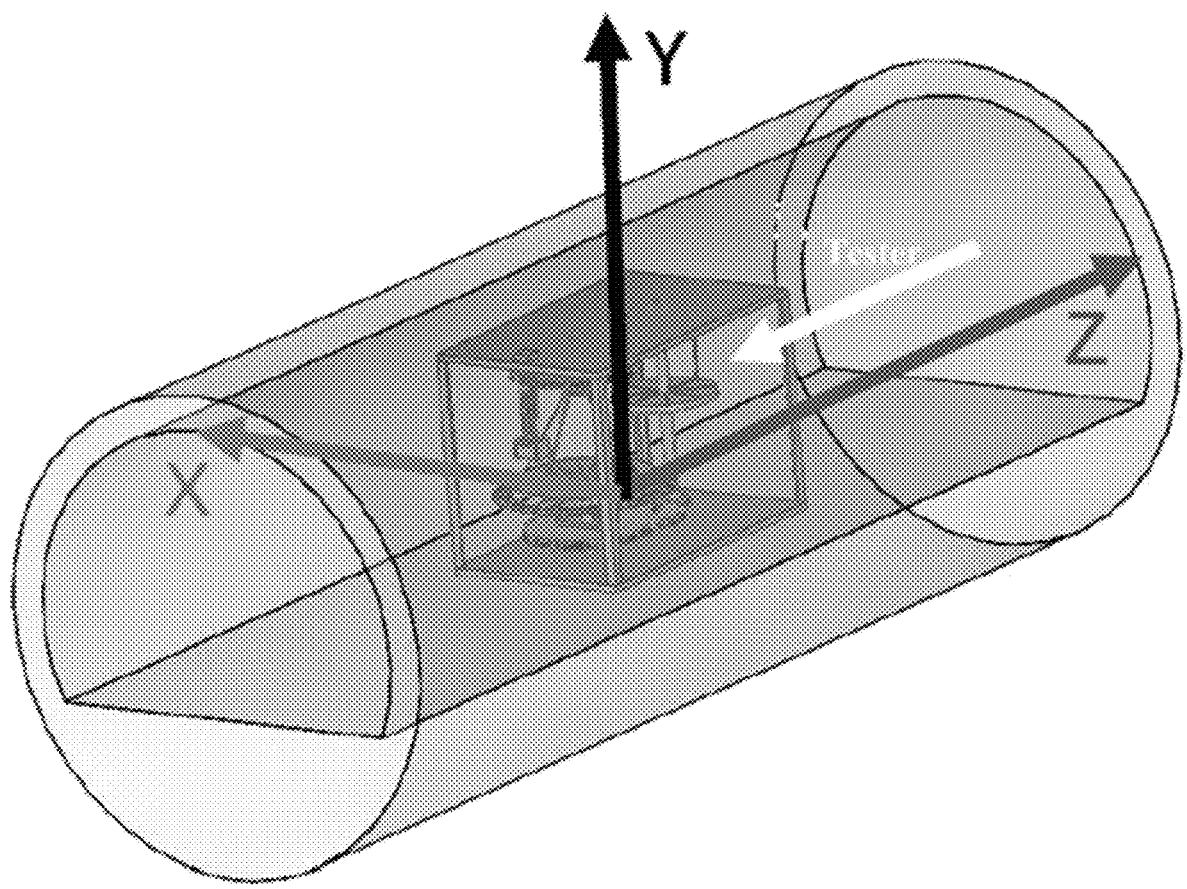
FIG. 4 illustrates a schematic view of the measurement device being placed inside magnetic resonance imaging equipment according to the disclosure.
Figure 5:
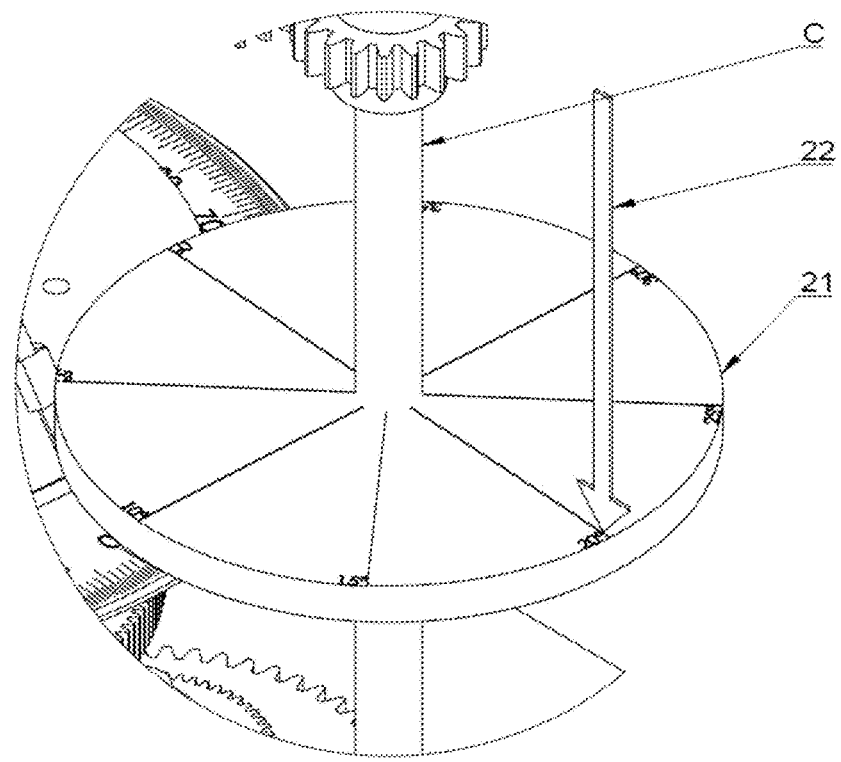
FIG. 5 illustrates a schematic enlarged view of a knob for angle adjustment according to the disclosure.
Figure 6:
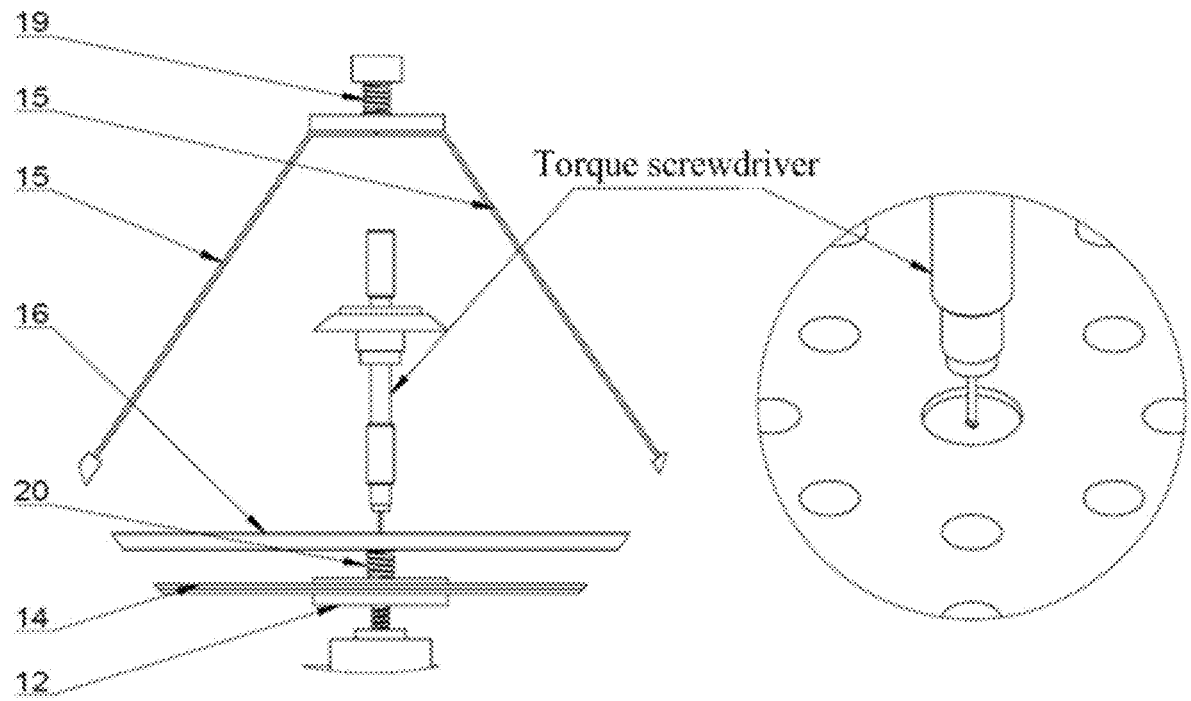
FIG. 6 illustrates a schematic view of a torque screwdriver rechecking torque according to the disclosure.
Figure 7:
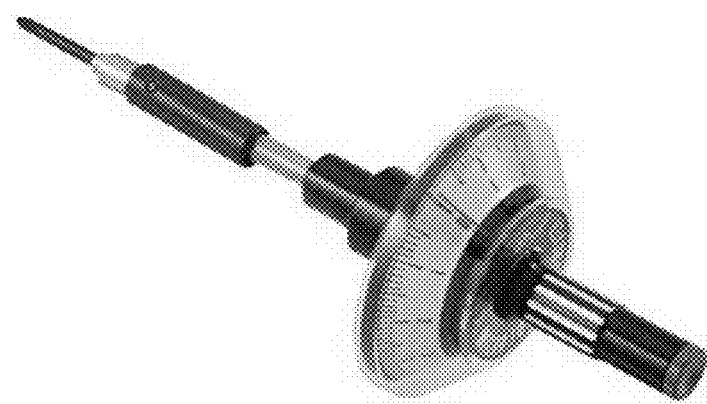
FIG. 7 illustrates a practicality picture of the torque screwdriver according to the disclosure, the torque screwdriver is connected to a physical interface and rotated during measurement.
Figure 8:
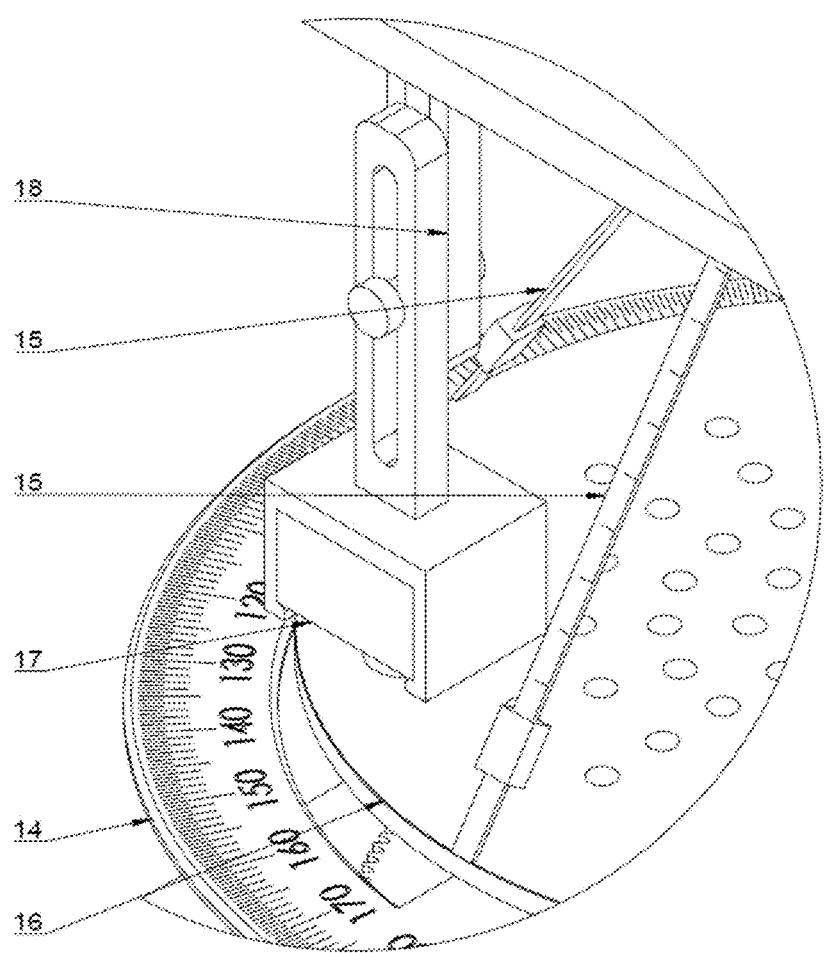
FIG. 8 illustrates a schematic enlarged view of a nuclear magnetic resonance compatible camera according to the disclosure.
Figure 9:
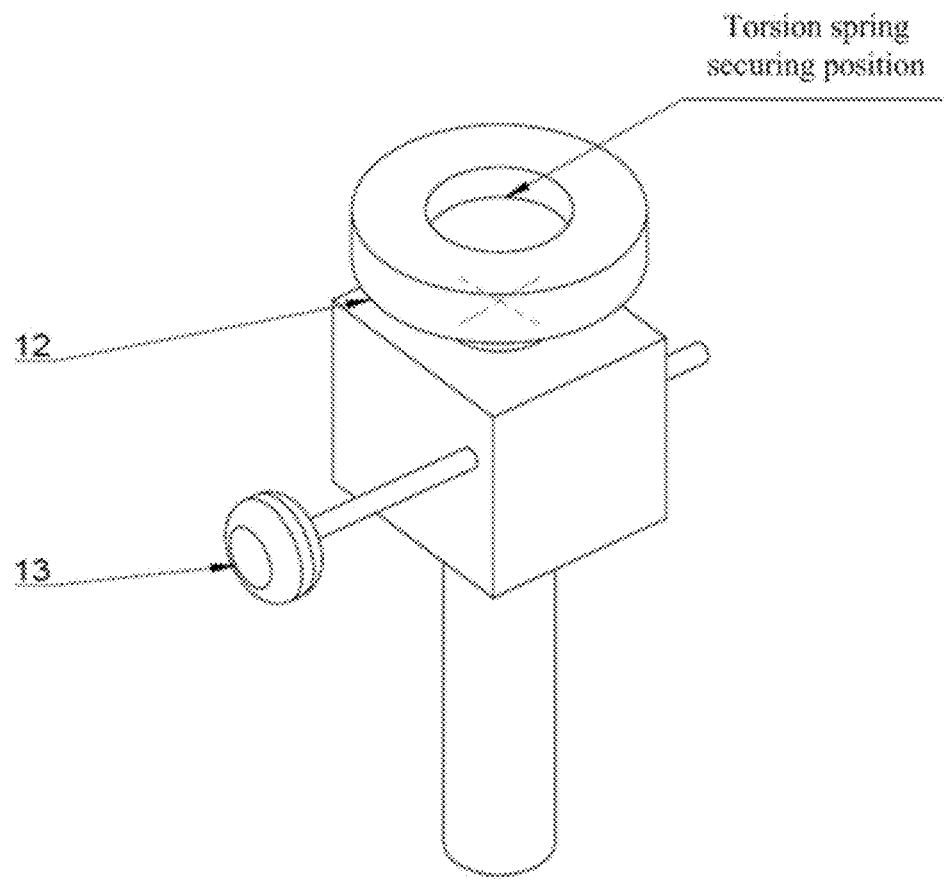
FIG. 9 illustrates a schematic view of the lifting platform according to the disclosure.
Figure 10:
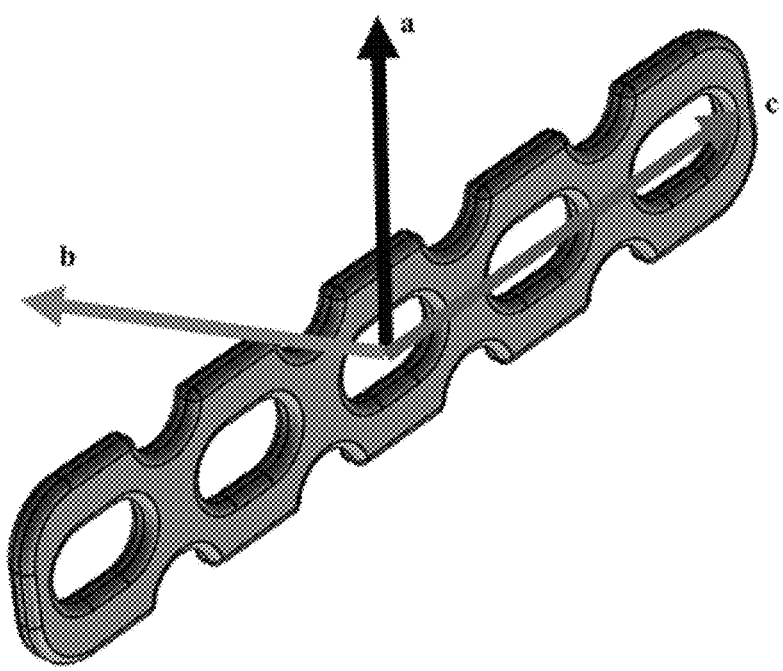
FIG. 10 illustrates a schematic view of coordinate axes of a sample according to the disclosure.

Connections among components of the disclosure include bolt connection, adhesive joint, shaft-hub connection, perforation fixation, and detachable connection (for torsion spring set). Transmission shafts A, B, A', B' and C are connected with the rectangular outer frame by the bolt connection, the adjustment belts are connected with the loading tray and a connecting sheet by the perforation fixation; the protractor is connected with the lifting platform by the adhesive joint; the gears are connected with the transmission shafts by the shaft-hub connection; and the detachable gears are connected with the loading tray, the lifting platform, the connecting sheet and the transmission shaft A (as shown in FIG. 3) by the detachable connection.

A magnetically induced torque measurement device based on a torsional spring method according to a specific embodiment of the disclosure is provided. As illustrated in FIG. 1 through FIG. 9, the measurement device includes gear 1, gear 2 meshes with gear 1, gear 3, gear 4 meshes with gear 3, and another set of gears 1', 2', 3', 4' symmetrical with respect to the set of gears 1, 2, 3, 4 and meshes in the same manner, a detachable torsion spring set, a rectangular outer frame, an indicator, a knob, transmission shaft C, transmission shaft B, transmission shaft A, transmission shaft A', transmission shaft B', a protractor, adjustment belts, an MRI-compatible camera, and a loading tray.

Due to the directionality of a magnetic field, when an included angle between an orientation of a sample placed in the MR system and the magnetic field is different, the magnitude of magnetically induced torque is different correspondingly. In order to measure the maximum magnetically induced torque, the deflection angle of the sample is measured every 10 degrees of rotation in the range of 0 to 360 degrees. Specifically, as illustrated in FIG. 3, a tester enters a testing chamber along a direction denoted by the arrow, uses the knob to adjust the angle of the loading tray, and uses the nuclear magnetic resonance compatible camera to record deflected angles of the loading tray before and after each time of rotation. For the gear sets used in the measurement device, gear 1 meshes with gear 2, gear 3 meshes with gear 4, and gear 2 and gear 3 rotate synchronously, i.e., angular velocities ($w_2=w_3$) are the same. The numbers of teeth of the four gears respectively are $Z1=180$, $Z2=60$, $Z3=60$, and $Z4=20$. During gear transmission, the number of teeth is directly proportional to the radius of the gear, and inversely proportional to the angular velocity, that is:

$$\frac{Z_1}{Z_2} = \frac{r_1}{r_2}, \frac{Z_3}{Z_4} = \frac{r_3}{r_4} \tag{1}$$

$$\frac{Z_1}{Z_2} = \frac{\theta_2}{\theta_1}, \frac{Z_3}{Z_4} = \frac{\theta_4}{\theta_3} \tag{2}$$

It can be obtained from the formulas (1) and (2):

$$\frac{\theta_1}{\theta_4} = \frac{Z_4}{Z_1} = \frac{20}{180} = \frac{1}{9} \tag{3}$$

where $Z_i$ represents the number of teeth, $\theta_i$ represents an angle, and i=1, 2, 3, 4.

That is, the rotation angle is amplified by nine times from gear 1 to gear 4, so that the knob being rotated with 90° can control the loading tray to be rotated with 10°

The tester calculates the deflection angle of the sample according to the difference of the angles before and after applying the magnetic field on the loading tray photographed by the Mill-compatible camera, and then calculates the magnetically induced torque of the sample according to the following formula (4):

$$\tau = k \cdot \Delta\theta \tag{4}$$

where $\tau$ represents the magnetically induced torque, k represents the elastic coefficient of the torsion spring, and $\Delta\theta$ represents the deflection angle of the loading tray.

In an illustrated embodiment of the disclosure, the material of the gears is polyoxymethylene (POM), dimensions of the gears respectively are as follows: gear 1: GB 1M 180T 14.5PA 12FW; gear 2: GB 1M 60T 14.5PA 12FW; the gear 3: GB 2M 60T 20PA 12FW; and the gear 4: GB 2M 20T 20PA 12FW.

In an illustrated embodiment of the disclosure, the material of the torsion springs is phosphor bronze, and the specification of the torsion springs is shown in the following Table 1.

TABLE 1 specification of the torsion springs and corresponding torque measurement ranges

| Serial Number | Unit | I | II | III | IV | V |
|---|---|---|---|---|---|---|
| Pitch diameter D | mm | 1.6 | 3 | 4 | 7 | 11 |
| Diameter d | mm | 0.25 | 0.45 | 0.7 | 1.2 | 1.8 |
| Pitch t | mm | 0.75 | 0.95 | 1.2 | 1.7 | 2.3 |
| Number of turns n | — | 3 | 3 | 4 | 4 | 3 |
| Elastic coefficient of torsion spring k | N · mm/(°) | 0.0207 | 0.1157 | 0.3810 | 1.8802 | 8.0763 |
| Torque measurement range | N · mm | 0.0207-0.5175 | 0.1157-2.8925 | 0.3810-9.525 | 1.8802-47.005 | 8.0763-201.9075 |

As seen from Table 1, the torque measurement range of the replaceable torsion spring sets is 0.0207 N·mm to 201.9075 N·mm.

Moreover, the disclosure further provides a method for verifying the accuracy of measurement results. In particular, the sample and the measurement device are transferred to an environment without a magnetic field and a torque screwdriver is used to rotate the loading tray to reproduce the deflection angle $\tau_{measure}$ of the sample in the magnetic field, and thereby measure torque and compare with the values calculated by the formula (4). The following formula (5) is used.

$$\delta = \frac{\Delta \tau}{\tau_{measure}} \quad (5)$$

where $\Delta\tau = |\tau - \tau_{measure}|$, $\delta$ represents a relative error, $\tau_{measure}$ represents the torque value measured by the torque screwdriver.

After the relative errors are calculated, when the relative errors are smaller than 6.6807%, the magnetically induced torque is calculated by the formula (4), and the deflection angle at this time is recorded; when the relative error is greater than 6.6807%, the torque spring set is not applicable, and it needs to replace the torsion spring set and measure again. Herein, 6.6807% is a defect rate of three Sigma level.

In an illustrated embodiment of the disclosure, the material of the adjustment belts of the measurement device is polyester, the material of each an adjustment buckle and the loading tray is light plastic, and the material of each of the rectangular outer frame, the indicator, the knob, the transmission shafts and the protractor is engineering plastic.

The foregoing description is only preferred embodiments of the disclosure, and those skilled in the art may make modifications without departing from the principle of the disclosure, and such modifications should be considered as the scope of protection of the disclosure.

What is claimed is:

1. A magnetically induced torque measurement device, comprising:

a rectangular outer frame (11) and five transmission shafts (A, B, C, A', B') secured on the rectangular outer frame, wherein a first transmission shaft (A), a second transmission shaft (B), a fourth transmission shaft (A') and a fifth transmission shaft (B') of the five transmission shafts are short shafts, upper ends of the first transmission shaft (A) and the second transmission shaft (B) are secured on an upper frame of the rectangular outer frame, lower ends of the fourth transmission shaft (A') and the fifth transmission shaft (B') are secured on a lower frame of the rectangular outer frame; the first transmission shaft (A), the second transmission shaft (B), the fourth transmission shaft (A') and the fifth transmission shaft (B') are pairwise symmetrical up and down; the first transmission shaft (A) and the fourth transmission shaft (A') are coaxial, the second transmission shaft (B) and the fifth transmission shaft (B') are coaxial, a third transmission shaft (C) of the five transmission shafts is a long shaft, and two ends of the third transmission shaft (C) are respectively secured on the upper frame and the lower frame of the rectangular outer frame;

two gear sets, wherein a first gear set of the two gear sets comprises four gears (1, 2, 3, 4), and a second gear set of the two gear sets comprises four gears (1', 2', 3', 4'); in the first gear set, a first gear (1) is secured on the first transmission shaft (A), a second gear (2) and a third gear (3) are secured on the second transmission shaft (B) and rotatable synchronously, a fourth gear (4) is secured on the third transmission shaft (C), the first gear (1) is meshed with the second gear (2), and the third gear (3) is meshed with the fourth gear (4); in the second gear set, a fifth gear (1'), a sixth gear (2'), a seventh gear (3') and an eighth gear (4') are symmetrically arranged with respect to the first gear (1), the second gear (2), the third gear (3) and the fourth gear (4) in the first gear set respectively; the fifth gear (1') is secured on the fourth transmission shaft (A'), the sixth gear (2') and the seventh gear (3') are secured on the fifth transmission shaft (B') and rotatable synchronously, and the eighth gear (4') is secured on the third transmission shaft (C);

a lifting platform (12), arranged on an upper end of the fourth transmission shaft (A') and coaxial with the fourth transmission shaft (A'), wherein the lifting platform is disposed with an adjustment knob (13) configured to adjust a height of a lower detachable torsion spring and thereby change a height of a loading tray and make the loading tray suitable for MR systems with different magnet center heights;

a protractor (14), attached to the lifting platform and coaxial with the fourth transmission shaft (A'), wherein the protractor is configured to measure a deflection angle of the loading tray;

four adjustment belts (15), wherein the upper ends of the four adjustment belts are connected to an upper detachable torsion spring by a connecting sheet, the lower ends of the four adjustment belts are fixedly connected to an edge of the loading tray, each of the four adjustment belts is provided with a scale, and the lower end of each of the fourth adjustment belts is equipped with an adjustment buckle configured to change a length of the adjustment belt according to a height of the lifting platform;

the loading tray (16), secured above the lower detachable torsion spring, wherein the loading tray is configured to fix a to-be-measured sample, and the loading tray is equipped with two indication marks configured to assist reading of the deflection angle of the loading tray;

an MRI-compatible camera (17), secured on a middle location of the rectangular outer frame by MRI-compatible camera support (18) and configured to photograph the deflection angle of the loading tray;

a detachable torsion spring set, comprising the upper detachable torsion spring (19) and the lower detachable torsion spring (20), wherein the upper detachable torsion spring (19) is secured on a lower end of the first transmission shaft (A) and rotatable along with the rotation of the first gear (1), the lower detachable torsion spring (20) is secured on the lifting platform and rotatable along with the rotation of the lifting platform;

a knob (21), coaxially secured in the middle of the third transmission shaft (C), wherein the knob is provided with angle marking lines configured to display a rotation angle of the loading tray controlled by the knob, and the knob is configured to be rotated to drive the gear sets to rotate through the third transmission shaft (C); and an indicator (22), wherein an upper end of the indicator is secured on the upper frame of the rectangular outer frame, the indicator is vertically downward, a lower end of the indicator is aligned with an edge of the knob, and the indicator (22) is configured to obtain an angle change of the loading tray according to a scale when the knob is rotated.

2. The magnetically induced torque measurement device as claimed in claim 1, wherein the rectangular outer frame comprises two plates and four supports; the indicator, the MRI-compatible camera support and the five transmission shafts are all secured on the rectangular outer frame.

3. The magnetically induced torque measurement device as claimed in claim 1, wherein the detachable torsion spring set is multiple sets, each of the multiple sets comprises two identical torsion springs, so as to make a measurement range of the detachable torsion spring set meets measurement requirements of implanted medical devices.

4. The magnetically induced torque measurement device as claimed in claim 1, wherein the MRI-compatible camera support is detachable and is adjustable in height to make a lens of the MRI-compatible camera focus on the protractor.

5. The magnetically induced torque measurement device as claimed in claim 1, wherein the loading tray is provided with evenly distributed perforations, and the perforations are configured to allow a thread to pass therethrough and thereby fix the sample when using the thread to fix the sample.

6. A torque measurement method using the magnetically induced torque measure device as claimed in claim 1, comprising:

a first step: calculate a worst gravity moment $\tau_{worst} = m \cdot L_{maximum} \cdot g$ of the sample according to a mass m and a maximum linear dimension $L_{maximum}$ of the sample, select a target detachable torsion spring set according to the worst gravity moment and securing the target detachable torsion spring set on the measurement device;

a second step: rotate the adjustment knob of the lifting platform to adjust the height of the loading tray to be consistent with a known magnet center height, and simultaneously adjust the lengths of the four adjustment belts to make the four adjustment belts tight;

a third step: fix the sample on the loading tray by a thread, then place the measurement device on the bed of the MR system, and based on a built-in cross-positioning of the magnetic resonance equipment, move the bed to position the center of the sample to a magnet center;

a fourth step: a tester enters a testing chamber, and turns the knob to adjust the angle of the loading tray and thereby make the axis of the sample coincide with a Z-axis of a magnet coil;

a fifth step: rotate the knob with 90° to make the loading tray be rotated with 10° and continue rotating until the loading tray is rotated with 360°, and recording a change of the angle of the loading tray before and after each time of the loading tray being rotated through the MRI-compatible camera;

a sixth step: calculate the deflection angle of the sample as $\Delta\theta = \theta_{after} - \theta_{before}$ according to recorded angles $\theta_{before}$, $\theta_{after}$ of the loading tray before and after each time of the loading tray being rotated, and calculate magnetically induced torque of the sample according to formula $\tau = k \cdot \Delta\theta$, where $\tau$ represents the magnetically induced torque, and k represents an elastic coefficient of torsion spring; and a seventh step: recheck the magnetically induced torque calculated in the sixth step; when relative errors of all calculated values are within a specified range, continue using the selected target detachable torsion spring set, change the fixed direction of the sample to make another axis of the sample coincide with the Z axis at an initial measurement position, and repeat the fourth through sixth steps; when the relative error of any one of the all calculated values is not within the specified range, replace with a larger or a smaller detachable torsion spring, do not change the fixed direction of the sample, and repeat the fourth through sixth steps until relative errors of all calculated values meet a relative error requirement.

7. The torque measurement method as claimed in claim 6, wherein recheck the magnetically induced torque calculated in the sixth step, comprises:

building a physical interface on a center of an upper end of the loading tray, wherein the physical interface is configured to connect a torque screwdriver in a non-magnetic resonance imaging environment;

connecting the torque screwdriver to the physical interface, rotating the torque screwdriver to reproduce deflection angles of the loading tray of the measurement device arranged at the magnet center and loaded with the to-be-measured sample;

recording torque readings of the torque screwdriver at the respective deflection angles; and comparing recorded torque readings of the torque screwdriver with the all calculated values of the magnetically induced torque to obtain the relative errors.

* * * * *